US005199886A

United States Patent [19]

Patterson

[11] Patent Number: 5,199,886

[45] Date of Patent: Apr. 6, 1993

[54] SHROUDED CONNECTOR ASSEMBLY

[75] Inventor: Robert A. Patterson, Harrisburg, Pa.

[73] Assignee: AMP Incorporated, Harrisburg, Pa.

[21] Appl. No.: 795,172

[22] Filed: Nov. 19, 1991

[51] Int. Cl.$^5$ .................................... H05K 1/00

[52] U.S. Cl. ............................ 439/79; 439/686

[58] Field of Search ................ 439/79, 381, 78, 80, 439/733, 752, 700, 686, 695, 696, 701

[56] References Cited

U.S. PATENT DOCUMENTS

| | | | |
|---|---|---|---|
| 4,550,962 | 11/1985 | Czeschka | 439/78 |
| 4,589,585 | 5/1986 | Long, Jr. | 439/79 X |
| 4,836,791 | 6/1989 | Grabbe et al. | 439/79 |
| 4,842,528 | 6/1989 | Frantz | 439/80 |
| 4,857,017 | 8/1989 | Erk | 439/79 X |
| 4,898,546 | 2/1990 | Elco et al. | 439/607 X |
| 4,900,258 | 2/1990 | Hnatuck et al. | 439/79 X |
| 4,935,454 | 6/1990 | Koblitz et al. | 522/24 |
| 4,952,172 | 8/1990 | Barkus et al. | 439/79 X |

*Primary Examiner*—David L. Pirlot

[57] ABSTRACT

A shroud (50) for an electrical connector (12) of the type including a housing having opposed mating and exit faces (16, 20) and a mounting face (18) extending rearwardly in a plane perpendicular to that of the mating face (16) and a plurality of terminal members (42) secured in respective terminal-receiving apertures (26) of the housing (14). The terminal members (42) extend from first contact sections (44) exposed for mating at the mating face to elongate tails extending from the exit face through right angle bends and to second contact sections (48) beyond the plane of the mounting face (18). The dielectric shroud (50) includes opposed bottom and top walls (54, 60) and opposed end walls (66) extending from housing-proximate edges adapted to be fitted against the exit face (20) thereof and a sidewall (52) extending between the top and bottom walls (60, 54). The bottom wall (54) includes an array of channels (56) extending rearwardly from the leading edge spaced and dimensioned to receive the second contact sections (48) upon the shroud (50) being inserted onto the exit face (20) from rearwardly thereof. The exposed portions of the terminal members (42) above the plane of the mounting face (18) are thereby enclosed within shroud (50).

2 Claims, 5 Drawing Sheets

SHROUDED CONNECTOR ASSEMBLY

FIELD OF THE INVENTION

This invention relates to electrical connectors and more particularly to connectors mounted to circuit boards and used to interconnect mother and daughter boards.

BACKGROUND OF THE INVENTION

Much of the electronic equipment of today includes the use of circuit boards having electrical components mounted thereto. A plurality of these boards (known as daughter boards) are electrically connected to a mother board or back plane. One means of interconnecting mother and daughter boards is to provide a connector along the edge of the daughter card that mates with a complementary connector on the mother board. The connector may be a straight mounted connector or a right angle mounted connector. The straight style connector is most often used when the boards are mounted in a horizontal orientation and the right angle connector is used when the mother and daughter boards are mounted in a perpendicular orientation.

In mounting connectors to boards, it is desirable to protect the mating portions of the terminals from solder and flux. One way to protect the mating terminals within the housing is to provide a sealing material or a piece of tape along the lower edge of the housing. The use of tape is particularly suitable for straight mounted connectors where the tape can be easily slid over the extending straight terminal tails, but tape is not especially suitable for terminals having right angle bends. Use of a sealant material, such as those disclosed in U.S. Pat. No. 4,935,454, is suitable for both straight mount and right mounted connectors when the wall of the housings through which the terminal solder tails exit is essentially flat such as found with straight mount connectors and some right angle mount connectors. The use of such a sealant is made more difficult by increasing the number of rows of terminals in the connector and/or providing housing structure between the adjacent rows of the connector to organize the terminal tails as the terminals exit the housing.

In many instances it is also desirable to provide the assembled circuit board with its components with a conformable coating material to seal and protect the devices from environmental contamination. The coating over all the components by a variety of methods such as, for example, dipping, spraying, and painting with the preferred method being dipping. Regardless of the method used, however, it is important that the viscous liquid not enter into the matable interface of the electrical connector. In the dipping method, the board is held such that the connector remains above the solution. The solution then coats all surfaces of the board except for the mating connector.

It is desirable, therefore, to have a means for preventing the conformal coating material from entering the mating terminal of connectors having the more complicated housing structure.

It is also desirable to have a means for protecting the matable interface of the connector that is compatible for use with automated processes.

In assembling circuit boards, the components and connector are mounted to one side of the board such that leads extend into the through-holes of the circuit board and are soldered to the circuit board along the lower or opposite surface thereof by methods such as wave soldering or the like. Problems associated with flux and solder materials entering the connector housing when alleviated with right angle mounted connectors since there is a longer length of terminal between the board through-hole and the mating portion of the terminal. In applying the coating material by the dipping method, however, coating material is applied to both surfaces simultaneously and if the coating gets sufficiently near to the connector some of the material will travel along the terminals and may migrate into the connector thereby rendering the mating portion of the connector unusable.

SUMMARY OF THE INVENTION

Accordingly, this invention is provided to alleviate problems associated with connectors of the type described above. The electrical connector assembly of the present invention includes an electrical connector and a shroud. For purposes of illustrating the invention the shroud is shown with a three row connector. It is to be understood that the shroud of the present invention may also be used with single as well as multi-row connectors having other configurations.

The connector is of the type having a housing extending rearwardly from a mating face to an opposed exit face and from a top face to an opposed mounting face with a plurality of terminal-receiving apertures arrayed in at least two rows and extending from the mating face to the exit face. The exit face includes at least one organizer plate extending rearwardly therefrom parallel to the mounting face to an edge between adjacent ones of said at least two rows. The connector includes a like plurality of terminals secured in respective ones of the apertures from first contact sections along the mating face to elongate tails extending from the exit face. The terminal tails further have intermediate sections extending to right angle bends held within corresponding recesses in an adjacent organizer plate edge and extending to second contact sections beyond the plane of the mounting face. The second contact sections are arrayed in at least two rows of exposed parallel pins for insertion and soldering into respective plated through-holes of a circuit board when the connector is mounted to the card. The shroud comprises a member of dielectric material having a top wall and opposed end walls extending from housing-proximate edges adapted to be fitted against the exit face thereof and extending rearwardly a distance at least equal to the rearwardmost extent of the connector, to a sidewall extending from the top wall to a lower edge in the plane of the mounting face. The member includes a bottom wall extending from the lower edge forwardly to a leading edge adapted to abut an adjacent portion of the exit face. The bottom wall also includes leading edge thereof and defining a plurality of tab-like portions. The channels are spaced and dimensioned to receive the second contact sections thereinto upon the shroud being inserted onto the exit face from rearwardly thereof. The shroud thereby encloses exposed portions of the terminals above the plane of the mounting face and minimizes entry of solder, flux and conformal coating material into the exit face of the connector. In the preferred embodiment, the shroud further includes means for self securing onto the connector. The means comprises grooves extending long an inside surface of the top wall from the connectorproximate edge and opposed from selected ones of intermediate sections of the terminals disposed above an uppermost one of the organizer plates and adapted to receive thereinto the selected ones of the terminals in an interference fit.

The shroud is attached to the connector by sliding the respective columns of terminals into the corresponding channels of the bottom wall and the respective tab-like wall portions between the adjacent columns of terminals. As the shroud is slid over the back portion of the connector, the leading edges of the shroud walls are moved forward until they abut the housing surface and the second connecting portion of the terminals are received within the channels and the shroud is secured to the connector. The connector assembly is then mounted to the board and is ready for soldering to the board. If desired, an adhesive such as an epoxy can be disposed along the stop surface to seal the leading end of the shroud against the housing. When the connector assembly is mounted to the board the segmented shroud wall lies adjacent the circuit board and prevents access to the dipping material to the forward or mating portion of the housing.

It is an object of the invention to provide a means whereby the circuit board assembly may be sealed with a conformal coating while minimizing access of the coating to terminals within a mating connector disposed along an edge of the board.

It is a further object of the invention to provide an insulated upper surface to a right angle connector that extends over the exposed intermediate portions of the terminals and also permits the use of metal stiffeners commonly used in the art particularly with multiple connectors mounted in tandem to the circuit board.

Additionally, it is an object of the invention to provide a means for facilitating automatic processes by providing a surface for applying bar codes, or other information needed during the manufacturing, storage, and use of the connector assembly.

Further advantages and specific details of the invention will become apparent herein by way of example in the following detailed description of the preferred embodiment taken in conjunction with the drawings.

DETAILED DESCRIPTION OF THE PREFERRED EMBODIMENT

Figure 1:
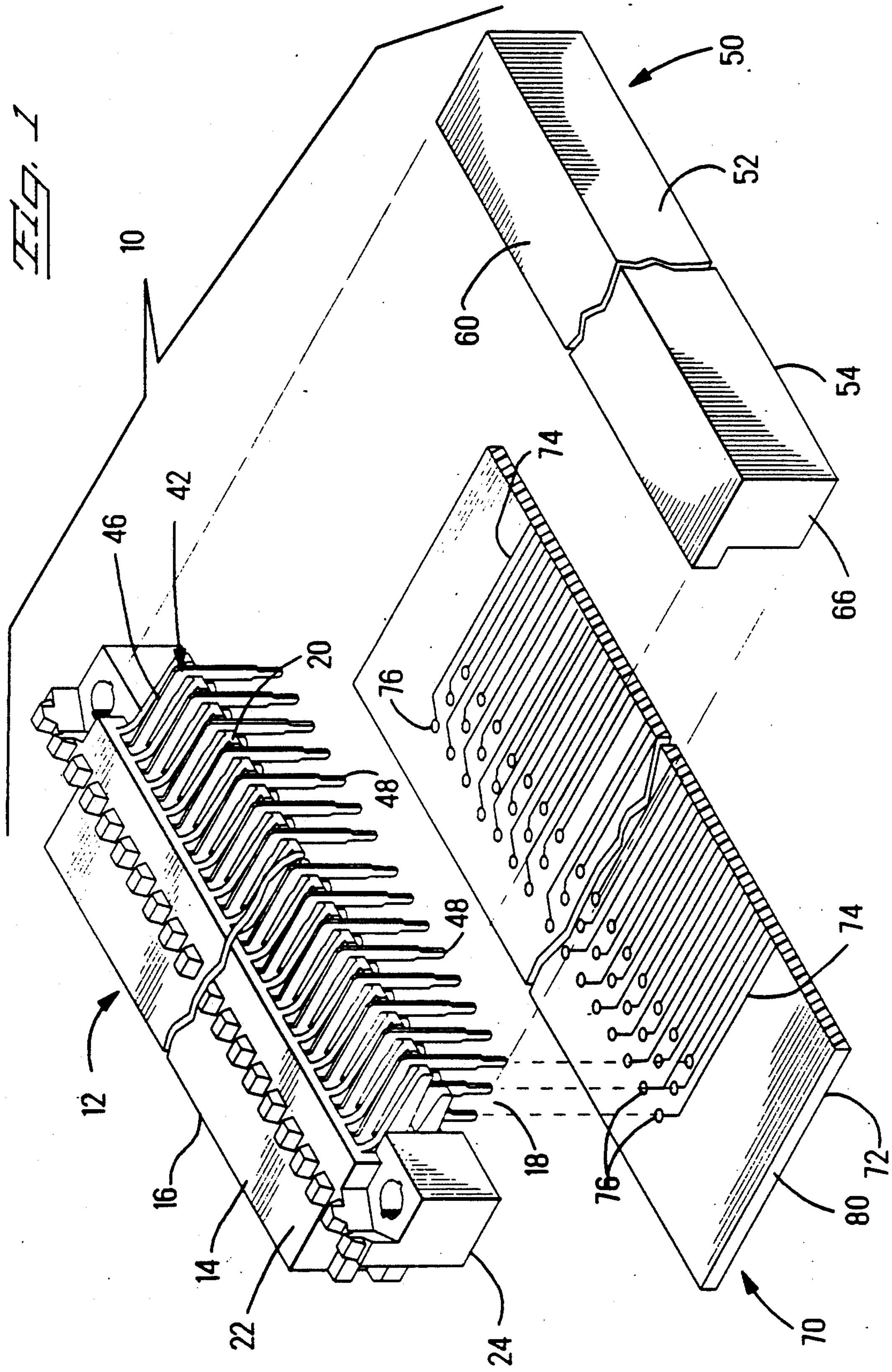
FIG. 1 is an exploded perspective view of the connector assembly of the present invention exploded from a circuit board.

Referring now to FIGS. 1, 2, 3 and 4, electrical connector assembly 10 comprises a connector 12 and a shroud 50. Connector 12 includes a housing 14 having an array of terminal members 42 disposed in a plurality of rows and arranged in columns. For purposes of illustrating the invention connector 12 is a right angle mount connector having three rows of terminals member 42. It is to be understood that the invention is not limited to the arrangement of terminal members as shown exit face 20, a mounting face 18, a top face 22 opposed end walls 24 and a plurality of terminal-receiving , apertures 26 extending between the mating and exit faces 16, 20. As can best be seen in FIGS. 3 and 4 housing 14 further includes internal walls 28, 30, which extend a selected distance rearwardly from the mating face to the organizer plates.

Figure 5:
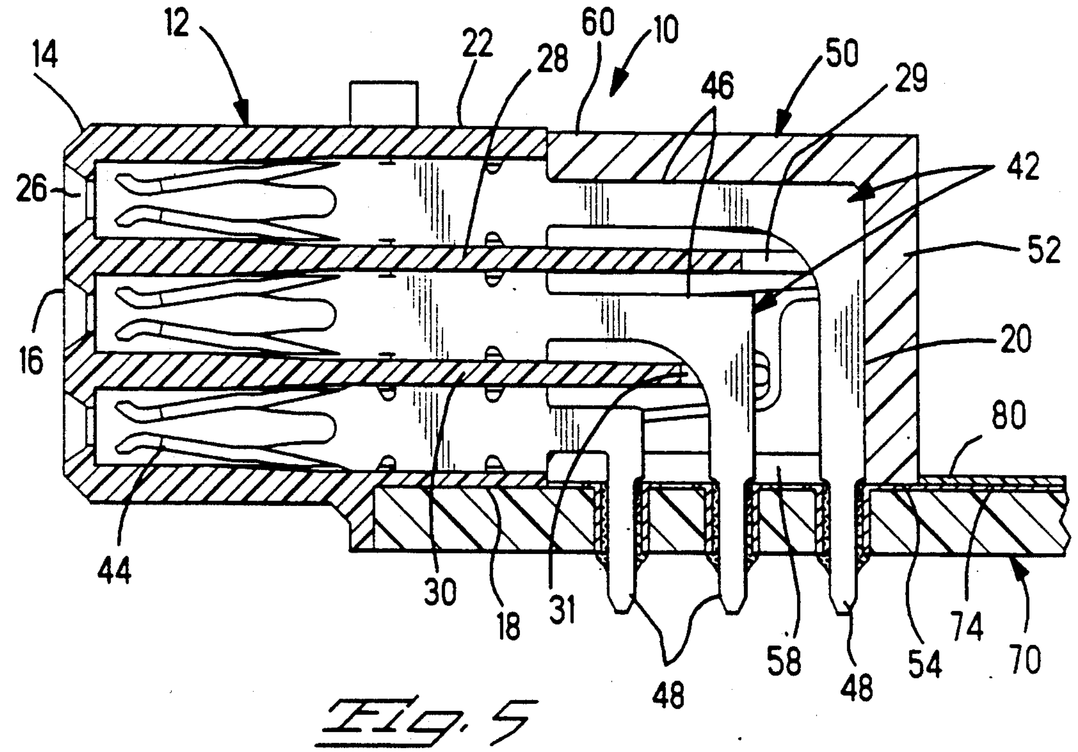
FIG. 5 is a cross sectional view of the assembled connector assembly mounted to the circuit board.

Terminal members 42 include a first connecting portion 44 exposed along the mating face 16 and adapted to mate with a complimentary terminal member of a complimentary connector (not shown), intermediate portion 46 including a right angle bend portion and a second connecting portion 48 for electrical engagement within through holes 76 of circuit board 70 upon the connector 12 being mounted thereto, as shown in FIG. 5. As can best be seen in FIGS. 3 and 4 the intermediate portions 46 of the various rows of terminal members are of differing length so that the second connecting portions 48 may be staggered in an aligned column along the mounting face 18 of the connector 12. The internal walls or organizer plates 28 and 30 disposed between adjacent rows of terminals include recesses 29, 31 respectively, which receive and provide support for the corresponding intermediate terminal portions 46, provide assistance in assembling the connector and also help in maintaining the true position of the second connecting portions 48 upon mounting connector 12 to a circuit board 70 as shown in FIG. 5.

Figure 2:
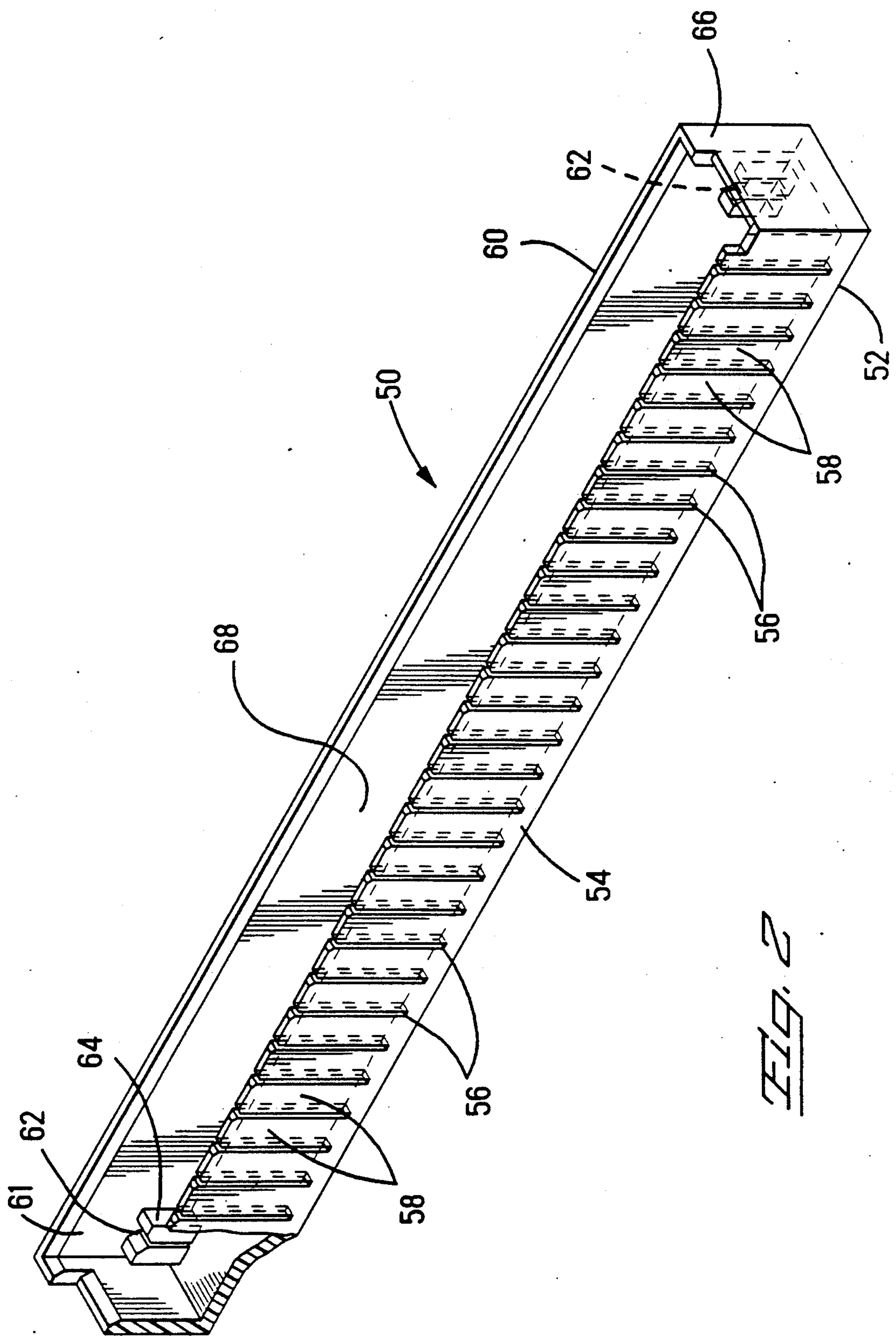
FIG. 2 is a perspective view of the shroud with a portion cut away to show internal structure thereof.
Figure 3:
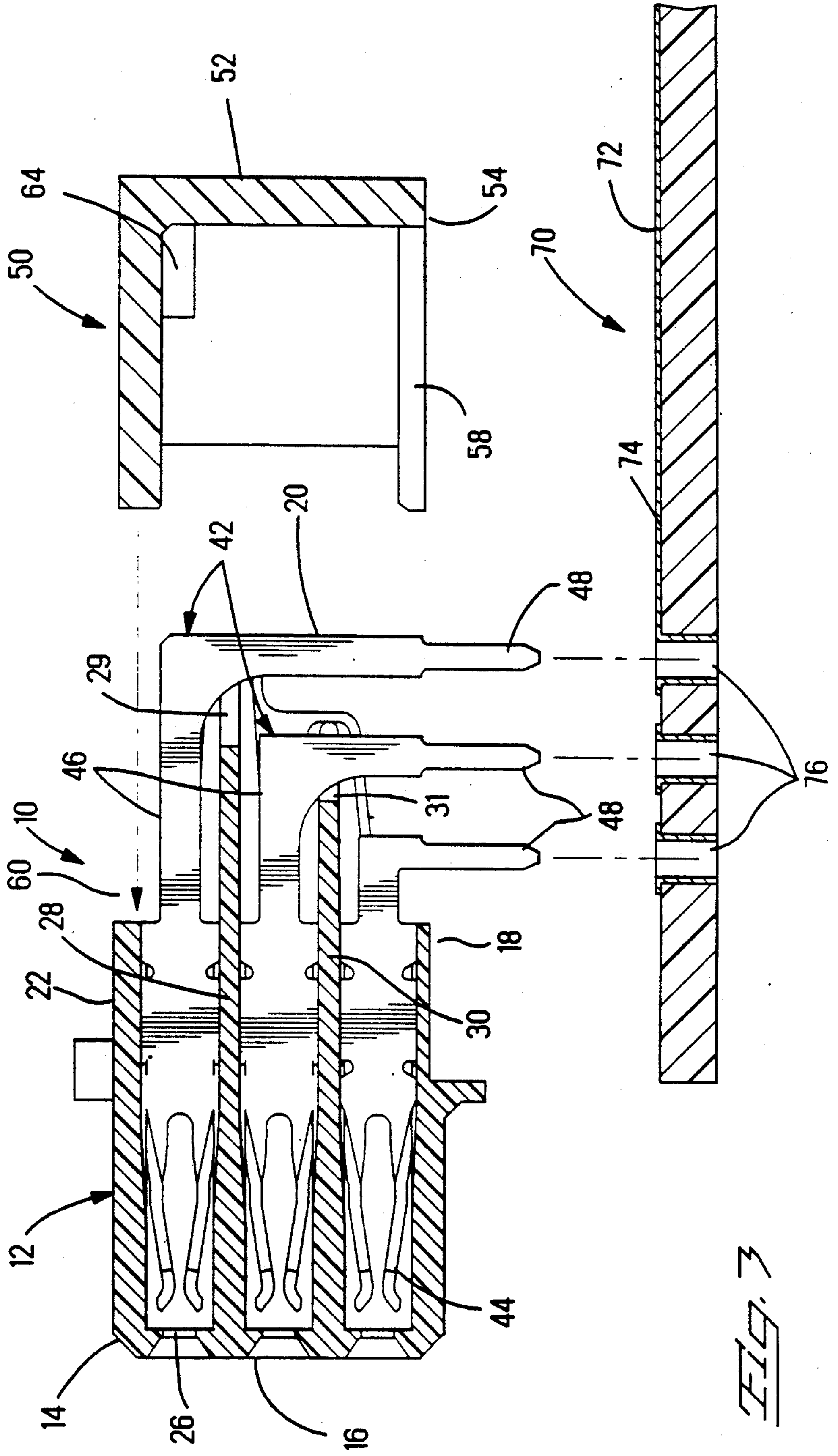
FIG. 3 is a cross sectional view of the exploded connector and shroud of FIG. 1.
Figure 4:
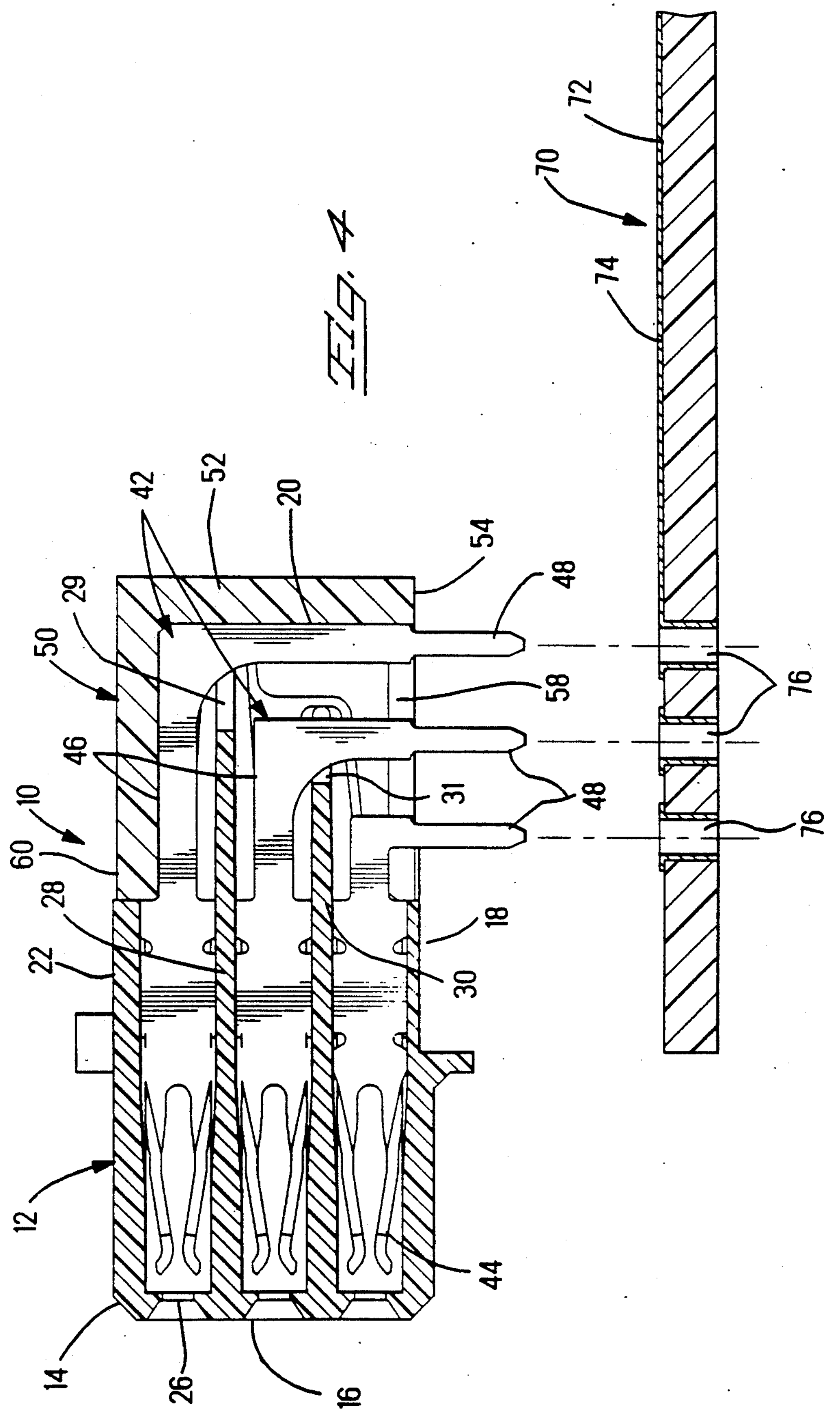
FIG. 4 is a view similar to that of FIG. 3 with the connector and shroud assembled.

Shroud 50 is a dielectric member and as best seen in FIG. 2, includes a sidewall 52, opposed bottom and top walls 54, 60 and end walls 66 together defining a cavity 68 dimensioned to receive and surround the back portion of connector 12 including the exposed terminal portions above the plane of the mating face 18. The top wall 60 and opposed end walls 66 extend from housing-proximate edges and are adapted to be fitted against the exit face 20 thereof and extend rearwardly a distance at least equal to the rearwardmost extent of the connector 12, to the sidewall 52, that extends from top wall 60 to a lower edge in the plane of the mounting face 18. Bottom wall 54 extends from the lower edge forwardly to exit face 20. The bottom wall 54 includes an array of channels 56 extending rearwardly from the leading edge dividing the wall into a plurality of tab-shaped portions 58. The channels 56 are spaced and dimensioned to receive the second contact sections 48 thereinto upon shroud 50 being inserted onto connector exit face 20 from rearwardly thereof. The tab-shaped portions 58 are configured to be received between adjacent columns 40 of second connector portions 48.

Shroud 50 is also designed to be self securing to connector 12. The shroud 50 is dimensioned to be received in an interference fit around the connector housing 14. In the presently preferred embodiment, as shown in FIG. 2, the inside surface 61 of top wall 60 includes a plurality of inwardly directed projections 64, each pair thereof defining a retention or self securing groove 62, which engage the intermediate portions 46 of selected terminal members 42 when the shroud 50 is mounted to the rear portion of connector 12. For purposes of illustrating the invention two retention grooves 62 are shown in FIG. 2. It is to be understood that additional retention grooves may be used depending upon the size of the connector and the desired retention force between the connector and the shroud.

Figure 6:
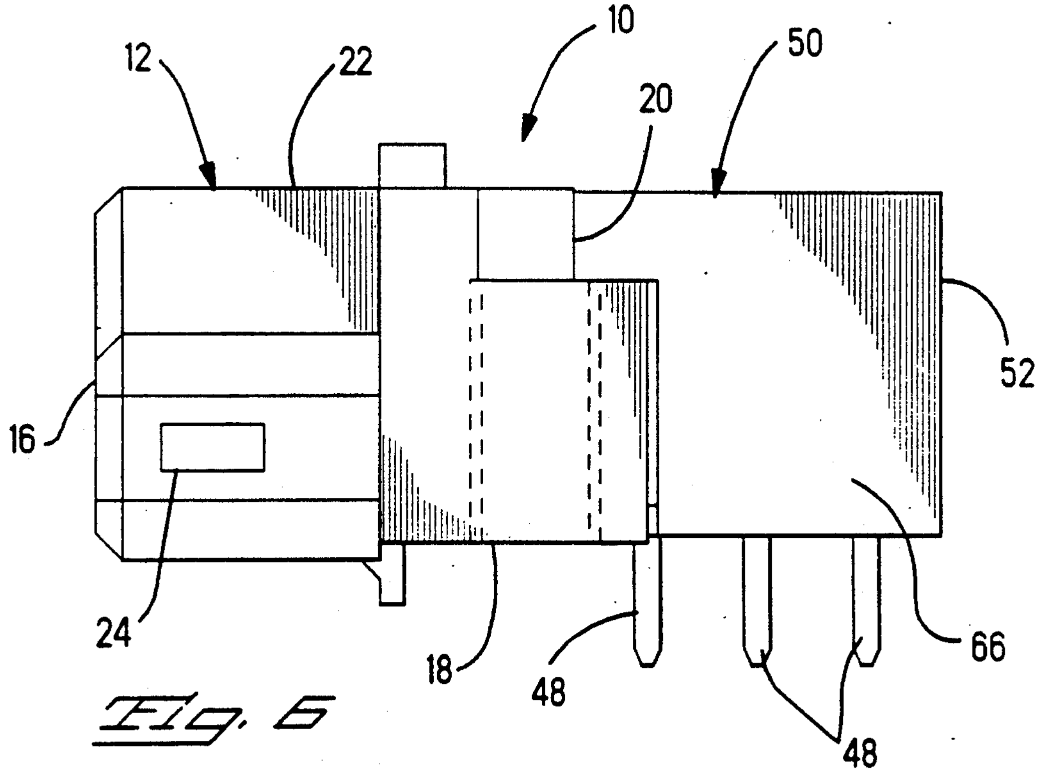
FIG. 6 is an end view of the connector assembly of FIG. 1.

Shroud 50 is mounted to the rear portion of connector 12 by aligning the channels 56 with a corresponding column of second terminal connecting portion 48 such that the wall portions 58 of first shroud side 54 are disposed between adjacent columns of second connecting portions 48. The leading edges of the sides and walls of the shroud 50 are moved until they engage housing 14 as best seen in FIG. 6. Shroud 50 thereby covers essentially all of the exposed terminal sections extending rearwardly from housing 14. The connector assembly 10 is then mounted to the circuit board 70 and soldered thereto as best seen in FIG. 5. As can be seen from FIG. 5 shroud side wall 52 acts as a dam to prevent the flow of the conformal coating 80 material into the exit face 20 of connector 12.

Shroud 50 further minimizes the flow of any flux or solder from the lower surface of the circuit board to the upper surface. Even if some of these materials are wicked up along the second connecting portion 48, there is a relatively substantially distance between the second connecting portion 48 and the first connecting portion 44 on the respective terminal members 42. FIG. 5 also shows the connector mounted to the board after the board has been dipped in a conformal coating 80 as can be seen by the Figure the rear wall 52 of shroud 50 acts as a dam to prevent the viscous coating material 80 from flowing between the terminal members 42 even if the back edge of the connector assembly is inadvertently dipped too close to the solution.

In an alternative embodiment of bead of epoxy or other adhesive stable at soldering temperatures, may be applied along the leading edge of bottom wall 52 as it abuts the connector housing 14 to seal the elongate area between the shroud 50 and the connector housing 14. Connector 12 is designed to be mounted to a circuit board 70 have opposed major surfaces 72 and a plurality of circuits 74 thereon. An array of through holes 76 are adjacent one edge of the board for receiving the corresponding second terminal section 48. Circuit board assemblies such as those used for daughter boards typically include a plurality of electronic components. For purposes of illustrating the invention, only that portion of the circuit board associated with connector assembly 10 will be shown. After all of the components (not shown) and connector assembly 10 have been soldered to the circuit board, the circuit board is covered with the conformal coating 80.

In making the connector assembly 10 of the present invention, the connector 12 and shroud 50 are completely assembled prior to mounting to the circuit board 70. The housing and shroud members 14, 50 are made from a dielectric material such as glass filled polyesters, or the like as known in the art. The terminal members 42 are stamped and formed from a phosphor bronze or other suitable material, as known in the art. The terminal members 42 are mounted into the housing 14 by inserting the first connecting portions 44 into respective ones of terminal-receiving apertures 26 from the rear of the housing 14. As described earlier, the recesses 29, 31 in organizer plates or internal walls 28, 30 receive portions of the terminal members 42 and help to align and position the various rows of terminal members 42 as they are inserted into the housing 14. Shroud 50 is then mounted to the rear of the connector 12 to cover the exposed intermediate and second terminal portions extending therefrom. The assembly 10 is then mounted to the circuit board 70 and along with other components (not shown) mounted thereto are soldered to the board by means known in the art, such as for example wave soldering. In accordance with the invention, the circuit board assembly is then dipped into an environmental conformal sealing material, such as for example a polyurethane material, which then is dried by air, and/or cured in an oven or by other means known in the art and appropriate to the selected coating material.

The present invention gives the advantage of being able to use cost effective manufacturing process and automated processes for coating and sealing circuit board assemblies. The shroud of the present invention provides a means to prevent egress of the environmental material into the forward mating portion of the connector.

The present invention overcomes the problems of the prior art in that it allows the conformal coating to be disposed closer to the edge of the board and the connector while minimizing damage to the contact. In addition the shroud provides an insulated upper surface to the connector that extends over the exposed intermediate portions of the terminals and also permits the use of metal stiffeners commonly used in the art particularly with multiple connectors mounted to the circuit board. Since there are no exposed sections of contacts, the metal stiffener can be applied in close proximity to the connector housing without the need for an additional insulating layer between the connector and the metal stiffeners. Additionally the shroud facilitates other automatic processes by providing a surface for applying bar codes, or other information needed during the manufacturing, storage, and use of the connector assembly.

It is thought that the connector assembly of many of its attendant advantages will be understood from the foregoing description. It will be apparent that various changes may be made in the form, construction and arrangement of the parts thereof without departing from the spirit or scope of the invention or sacrificing material advantages. The form herein described is a preferred or exemplary embodiment thereof.

I claim:

1. A shroud for an electrical connector of the type including a housing extending rearwardly from a mating face to an opposed exit face and from a top face to an opposed mounting face with a plurality of terminal-receiving apertures arrayed in at lest two rows and extending from the mating face to the exit face, the exit face including at least one organizer plate extending rearwardly therefrom parallel to the mounting face to an edge between adjacent ones of said at least two rows, the connector including a like plurality of terminal members secured in respective ones of the apertures from first contact sections along said mating face to elongate tails extending from the exit face, the terminal tails having intermediate sections extending to right angle bends held within corresponding recesses in an adjacent organizer plate edge and extending to second contact sections beyond the plane of the mounting face, the second contact sections being arrayed in at least two rows of exposed parallel pins for insertion and soldering into respective plated through-holes of a printed circuit card upon connector mounting to the card, the shroud comprising:

a member of dielectric material having a top wall and opposed end walls extending from housing-proximate edges adapted to be fitted against said exit face thereof and extending rearwardly a distance at least equal to the rearwardmost extent of said connector, to a sidewall extending form said top wall to a lower edge in said plane of said mounting face, said member including a bottom wall extending from said lower edge forwardly to a leading edge adapted to abut an adjacent portion of said exit face;

said bottom wall including an array of channels extending rearwardly from said leading edge spaced and dimensioned to receive thereinto said second contact sections upon said shroud being inserted onto said exit face from rearwardly thereof, thereby enclosing exposed portions of said terminal members above said plane of said mounting face and minimizing entry of solder, flux and conformal coating material into said exit face of said connector, where said shroud further includes grooves extending along an inside surface of said top wall form said sidewall and opposed from selected ones of intermediate sections of said terminal members disposed above an uppermost one of said organizer plate and adapted to receive thereinto said selected ones in an interference fit for self securing said shroud onto said connector.

2. A right angle connector assembly for mounting to a circuit board comprising:

a housing having a mating face and a mounting face, said mounting face being along a plane that is perpendicular to that of said mating face, said housing further including a plurality of terminal-receiving apertures extending from said mating face to said mounting face;

an array of terminal members disposed within respective ones of said terminal-receiving apertures, each said terminal member having first and second connecting portions and an intermediate portion extending therebetween, said first connecting portion being exposed at said mating face and adapted for mating with a corresponding terminal member of a complementary mating connector, said second connecting portion being adapted for engaging a through-hole of a circuit board upon mounting said connector to said circuit board and said intermediate portion including a bent section such that said first and second connecting portions extend at right angles to each other, said second connecting portion and at least a part of said intermediate portion being exposed along a back face of said housing; and a shroud including a side wall, opposed top and bottom walls and opposed end walls, which together define a cavity, said cavity being adapted to receive a rear portion of said connector housing, said bottom wall including a plurality of channels extending from a leading edge of said wall and toward said side wall, said channels dividing said bottom wall into a plurality of portions adapted to be received between adjacent columns of second connecting portions, thereby enclosing exposed portions of said terminal members above said plane of said mounting face and minimizing entry of solder, flux and conformal coating material into said connector, where said shroud includes grooves extending along an inside surface of said top wall from said sidewall and opposed from selected ones of intermediate sections of said terminal members and adapted to receive thereinto said selected ones in an interference fit for self securing said shroud onto said connector.

* * * * *